United States Patent
Parris et al.

(10) Patent No.: US 6,355,550 B1
(45) Date of Patent: Mar. 12, 2002

(54) ULTRA-LATE PROGRAMMING ROM AND METHOD OF MANUFACTURE

(75) Inventors: Patrice Parris, Phoenix; Bruce L. Morton, Austin; Walter J. Ciosek, Austin; Mark Aurora, Austin; Robert Smith, Austin, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/575,846

(22) Filed: May 19, 2000

(51) Int. Cl.[7] ............... H01C 21/44; H01C 21/8242; H01C 21/336; H01C 21/4763
(52) U.S. Cl. ............... 438/599; 438/241; 438/279; 438/622
(58) Field of Search ............... 438/241, 239, 438/279, 599, 618, 622, 598, 197

(56) References Cited

U.S. PATENT DOCUMENTS

| | | | |
|---|---|---|---|
| 4,021,781 A | 5/1977 | Caudel | 340/172.5 |
| 4,151,020 A | 4/1979 | McElroy | 148/187 |
| 4,208,726 A | 6/1980 | McElroy | 365/104 |
| 4,219,836 A | 8/1980 | McElroy | 357/55 |
| 4,230,505 A | 10/1980 | Wu et al. | 148/1.5 |
| 4,272,303 A | 6/1981 | Chatterjee et al. | 148/1.5 |
| 4,326,329 A | 4/1982 | McElroy | 29/571 |
| 4,342,100 A | 7/1982 | Kuo | 365/104 |
| 4,384,399 A | 5/1983 | Kuo | 29/571 |
| 4,390,971 A | 6/1983 | Kuo | 365/104 |
| 4,591,891 A | 5/1986 | Chatterjee et al. | 357/23.12 |
| 5,471,416 A | 11/1995 | Azmanov | 365/104 |
| 5,494,842 A | 2/1996 | Azmanov | 437/52 |
| 5,514,609 A | 5/1996 | Chen et al. | 437/45 |
| 5,585,297 A | 12/1996 | Sheng et al. | 437/52 |
| 6,107,666 A | 8/2000 | Chang | |
| 6,261,883 B1 * | 7/2001 | Koubuchi et al. | 438/197 |
| 6,303,442 B1 * | 10/2001 | Lee | 438/276 |

OTHER PUBLICATIONS

J. Wong et al., 1981 "IEEE International Solid–State Circuits Conference" Session XII: Memory Techniques, ISSCC81/Thursday, Feb. 19, 1981, pp. 150–151.

S. Ariizumi et al., 1986 "IEEE International Solid–State Circuits Conference" Session III: Nonvolatile and Application–Specific Memories, ISSCC86/Wednesday, Feb. 19, 1986, pp. 42–43.

Ariizumi et al., "WAM 3.2: A 70ns 2Mb Mask ROM with a Programmed Memory Cell," 1986 IEEE International Solid–State Circuits Conference, Session III: Nonvolatile and Application–Specific Memories, pp. 42–43.

Wong et al., "THPM 12.2: A 45ns Fully–Static 16 K MOS ROM," 1981 IEEE International Solid–State Circuits Conference, Session XII: Memory Techniques, pp. 150–151.

* cited by examiner

*Primary Examiner*—Richard Elms
*Assistant Examiner*—Adam Pyonin (57) ABSTRACT

A ROM embedded in a multi-layered integrated circuit includes rows of transistor memory cells. For reduced area, each transistor in a row optionally shares a terminal with an adjacent transistor in the row, whereby adjacent transistors share one of a source and a drain. A plurality of contact lines, one each connected to each common terminal, serve as address terminals for cells. A plurality of metal layers are connected to the other of the drain or source terminals by filled vias and include a final metal layer defining a metal pad for each of the other terminals. Filled vias couple selected metal pads to selected signal lines to provide "1" outputs from selected cells and signal lines which are not coupled by filled vias to the metal pads provide "0" outputs from selected cells.

18 Claims, 5 Drawing Sheets

ULTRA-LATE PROGRAMMING ROM AND METHOD OF MANUFACTURE

FIELD OF THE INVENTION

This invention relates, in general, to Read Only Memories (ROMs) and, more particularly, to ROMs and a method for manufacturing the ROMs, wherein the ROMs are capable of being programmed very late in the manufacturing process.

BACKGROUND OF THE INVENTION

Most, if not all, embedded microcontroller parts have a Read-Only-Memory (ROM) module on-board. During engineering development, system designers typically use embedded Non-Volatile Memory (NVM) to debug their microcontroller code. However, once the system and code have been released for customer use and volume production begins, often ROM is substituted for NVM. This decreases costs, both directly through die size reduction (program ROM can be a significant fraction of die size) and indirectly through lower probe and test costs.

Increasingly, customers see a substantial fraction of the value they add to a microcontroller system to be the Intellectual Property (e.g. software, algorithms, etc.) they build into the code the microcontroller is running. Thus, suppliers need to build die which are identical in all other aspects (CPU, digital modules, analog modules, I/O, etc.) but with different code stored in ROM. For maximum flexibility of their production lines, manufacturers would like to delay putting the code in ROM as late as possible in the fabrication process. A common inventory of wafers past the point of ROM coding will not serve all customers.

Another reason to delay putting the code in ROM is that customers sometimes wish to upgrade their code and algorithms. When these code changes and corrections are made, the customer looks for minimum cycle time. The earlier the code is stored in ROM, the longer the cycle time for code updates.

Together, these pressures have driven manufacturers to devise means of programming ROM at later and later stages in the fabrication process. ROMs programmed at Active Area formation are still used (U.S. Pat. Nos. 4,021,781, 4,151,020, and 4,208,726 for example) but ROMs with later programming are increasingly popular. The means of late ROM programming is accomplished by Ion Implantation before deposition of ILD0 (the first inter-level dielectric layer). Examples of this process are disclosed in U.S. Pat. Nos. 4,230,505, 4,342,100, 4,390,971, and 5,585,297. In some processes, programming data in ROM is delayed until slightly later in the process by implanting through etched-back ILD0 regions (U.S. Pat. No. 5,514,609), by using the metal as a mask (U.S. Pat. No. 4,384,399), using high energy implants or by using electron beams (U.S. Pat. Nos. 4,272,303 and 4,591,891). Programming has also been delayed until contact formation (U.S. Pat. Nos. 4,326,329, 4,219,836, 5,494,842, and 5,471,416). In this last approach, the ROM is programmed using contacts to the gates of transistors in the array. Some ROM designs which delay programming until later in the back-end result in a large bitcell size.

Many modern processes for high-performance applications have as many as five layers of metal. Increasing numbers of interconnect layers are likely to be used in conjunction with planarization techniques like Chemical Mechanical Polishing (CMP). The increased back-end cycle time means that ROM programming at a step close to ILD0 deposition is no longer "late" in the process. In order to keep the cycle time for customer ROM code changes low, ROM programming must be moved even later in the process. Further, bitcell size must be kept small and even reduced if possible.

Accordingly, it is highly desirable to provide methods and structures which overcome these problems, which are inexpensive and easy to perform, install and use. Further, in some specific applications, the structure has a substantially reduced chip area.

DETAILED DESCRIPTION OF THE DRAWINGS

As will be explained in detail below the present disclosure deals with a Read Only Memory (ROM) array preferably embodied as a portion of an integrated circuit such as a finished ROM or ROM portion of a processor or the like. In overview this ROM includes a semiconductor substrate having a plurality of switching transistors formed thereon, where each switching transistors is logically and likely geometrically arranged in an array having first and second dimensions, with switching transistor operating as a memory cell.

Each memory cell further includes a control terminal such as a gate or base terminal and a first and second controlled terminal such as a drain and source or emitter and collector. In the preferred embodiment the control terminal and one of the controlled terminals act as address lines or signal lines for the memory cell so as to provide a means for selectively enabling a given memory cell.

The second controlled terminal, drain or collector, is selectively coupled by filled vias, to one or more evaluate or read or bit lines, preferably a first and second evaluate line whereby each memory cell encodes a plurality of states corresponding to each evaluate line. For various performance reasons these states are generally one state for no or zero evaluate lines coupled to the controlled terminal and one state each for each evaluate line being coupled to the controlled terminal. Furthermore the ROM preferably includes two or more conductive interconnect layers with a first or earlier or lower layer including one and possibly both of the address lines. These address lines are preferably oriented along a first logical or column dimension of the array where each cell in the column shares the same address lines.

A second and later conductive layer includes one and preferably both of the first and second evaluate lines. Preferably the evaluate lines will be oriented along a second logical or row dimension of the array with each memory cell in the row sharing the same evaluate lines. This advantageously allows the very latest stages of the ROM manufacturing process to determine the ROM programming by providing, filling the selected vias at a very late stage in the process. The ROM may further include a third, fourth and so on evaluate line each selectively coupled to the second controlled terminal wherein these additional evaluate lines may be optionally formed in earlier or a penultimate conductive layer. Note with a first, second and third evaluate line a memory cell can encode a plurality of bits corresponding to the memory cell, specifically 4 states suitable for encoding 2 bits per cell. Each of these concepts and more will be explained in detail with reference to the illustrations, for various embodiments in accordance with the present invention.

Figure 1:
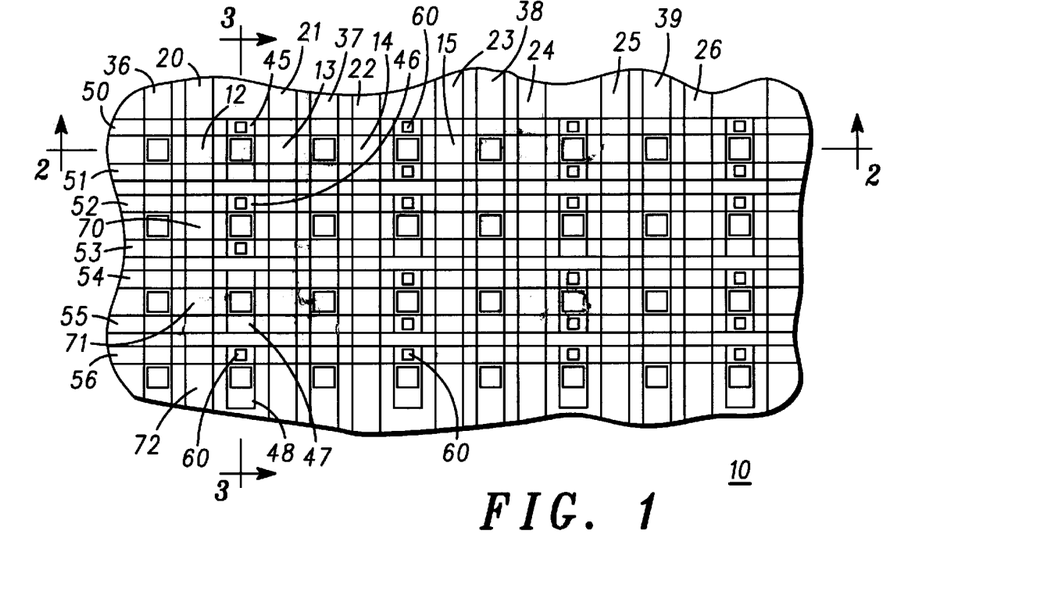
FIG. 1 is a plan view, portions thereof broken away, of a ROM array in accordance with an embodiment of the present invention.
Figure 2:
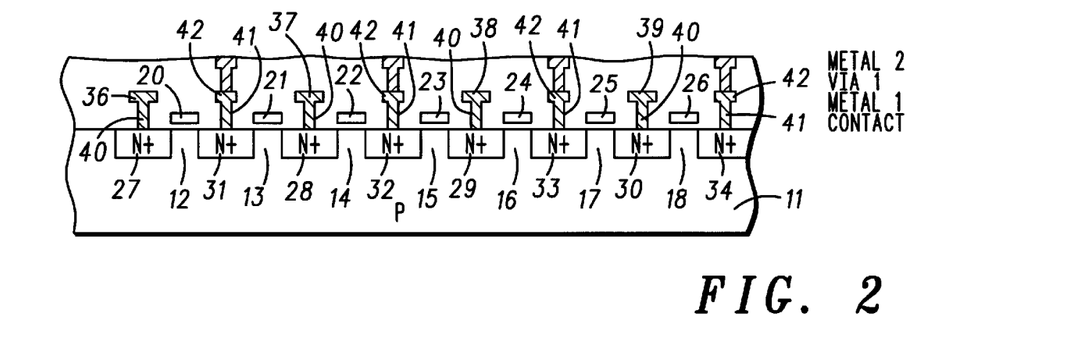
FIG. 2 is a sectional view, portions thereof broken away, as seen from section line 2—2 in FIG. 1.

Thus, FIG. 1 is a plan view of a Read Only Memory (ROM) 10 in accordance with an embodiment of the present invention. ROM 10 is preferably embedded in a multi-layered integrated circuit as an integral portion of the circuit in accordance with standard manufacturing techniques. Referring additionally to FIG. 2 which is taken along section line 2—2 of FIG. 1, ROM 10 includes a semiconductor substrate 11 having a plurality (seven in this view) of switching transistors 12, 13, 14, 15, 16, 17, and 18 formed thereon. It should be understood that transistors 12, 13, 14, 15, 16, 17, and 18 are only a portion of a single row in an array of transistors, with portions of four rows being illustrated in the top plan view of FIG. 1. Similarly transistors 12, 70, 71,72 are a portion or section of a single column in the array of transistors with portions of seven columns being illustrated in FIG. 1. As will be explained in more detail presently, each transistor operates as a memory cell with transistors 12, 13, 14, 15, 16, 17, and 18 defining a row (or partial row) of memory cells and 12, 70, 71, 72 defining a column (partial) of memory cells. In this specific embodiment NMOS transistors are utilized but it will be understood by those skilled in the art that other conductivities and types of transistors can be utilized. It should be further understood that although the portion of ROM 10 taken along section line 2—2 is described as a section of a row of memory cells and the portion of ROM 10 taken along section line 3—3 is described as a section of a column of memory cells, this is an arbitrary definition. In other words, the portion of ROM 10 taken along section line 2—2 can be described as a section of a column of memory cells and the portion of ROM 10 taken along section line 3—3 can be described as a section of a row of memory cells.

Transistors 12, 13, 14, 15, 16, 17, 18, 70, 71 and 72 can be manufactured using any convenient technology. For example, in this embodiment a layer of gate oxide is formed on the surface of substrate 11 and using common patterning techniques gates 20, 21, 22, 23, 24, 25, and 26 are formed. Control terminals or Gates 20, 21, 22, 23, 24, 25, and 26 are, for example, polysilicon which may be doped to improve conductivity. Further, each of gates 20, 21, 22, 23, 24, 25, and 26 is formed as a long strip of conductive material which extends perpendicular to the paper in FIG. 2 for the length of the transistor array or sub-array so that the transistors in the array or sub-array are also aligned in columns. Drains 27, 28, 29, and 30 and sources 31, 32, 33, and 34 are formed, using standard self-aligned implant techniques.

Here it should be noted that controlled terminals or drains 27, 28, 29, and 30 and the other controlled terminals or sources 31, 32, 33, and 34 alternate along the row in FIG. 2 so that each transistor (e.g., transistors 12, 13, 14, 15, 16, 17, and 18) in the row shares a common terminal with an adjacent transistor in the row. For example, first adjacent pair of transistors 12 and 13 in the row share source terminal 31, while alternate or second adjacent pair of transistors 13 and 14 in the row share drain terminal 28, etc. Thus, first adjacent pairs of transistors (i.e., 12/13, 14/15, 16/17) in each row share a source terminal and alternate adjacent pairs of transistors in the row (i.e., 13/14, 15/16, 17/18) share a drain terminal.

The common terminal concept is optional and is included in this embodiment to further reduce memory area. However, if substrate area is not a concern, individual transistors can be fabricated, rather than transistors sharing a common terminal. It should be further understood that in the preferred embodiment where MOS memory cells or transistors are used, the respective terminals being referred to as source or drain is arbitrary as the transistors are inherently symmetrical in operation. For this reason in the art these terminals are often referred to as source/drains and here in may be referred to as controlled terminals. In operation of an NMOS transistor the source normally denotes the terminal coupled to the lower potential of the two terminals or the terminal to which current will flow when the cell or transistor is enabled or turned on and the drain is coupled to a positive potential.

Each drain terminal 27, 28, 29, and 30 is connected to a first signal line, which in this embodiment is designated as a "pre-charge" line. It should be noted that the first signal line may be used as a "pre-charge" line in some modes of operation and not in others. Generally, during operation the "pre-charge" line is connected to some common potential, such as ground, to complete a circuit through each of the transistors or memory cells. In the embodiment illustrated in FIGS. 1, 2, and 3, "pre-charge" lines 36, 37, 38, and 39 are formed in a first metal layer and extend perpendicular to the paper in FIG. 2 so as to extend parallel with each column of transistors in the array (see FIG. 1). Each drain for each transistor is connected to the adjacent one of "pre-charge" lines 36, 37, 38, and 39 by contacts 40. Note that the portion or section of the column of transistor formed by transistors 12, 70, 71, and 72 share a common strip of conductive material such as polysilicon or metal to form the gate 20 for each transistor and similarly share a common "pre-charge" or first signal line 36. Here it will be understood that once the array of transistors is formed, the entire array is covered with a layer of insulating material (e.g. silicon oxide) which is then (optionally planarized and) patterned to form openings for contacts 40 (and other contacts to be explained presently). The openings are filled part of first metal layer with a conductive material to form contacts 40 (and optimally, that other contacts). Suitable material for filling the vias include metals, polysilicon, or the like. The first metal layer is then deposited to form contacts 40, 41 (if metal) and pre-charge lines 36, 37, 38, and 39, as well as any other contacts or connecting lines included in the first metal layer.

In addition to contacts 40 connecting "pre-charge" lines 36, 37, 38, and 39 to drains 27, 28, 29, and 30, respectively, contacts 41 electrically connect sources 31, 32, 33, and 34 to lines 42 in the first metal layer. Depending upon the specific integrated circuit (and the number of metal layers 'n' in the IC) in which ROM 10 is embedded, a plurality 'n−1' of layers are connected to the shared source terminals 31, 32, 33, and 34 and to each other by conductive vias filled with an electrically conductive material; hence, the vias are referred to as filled vias. It will be understood that the conductive layers are most generally formed of metal and will be referred to as metal layers herein but other conductive materials (such as doped semiconductor material) can be used in some specific applications.

Figure 3:
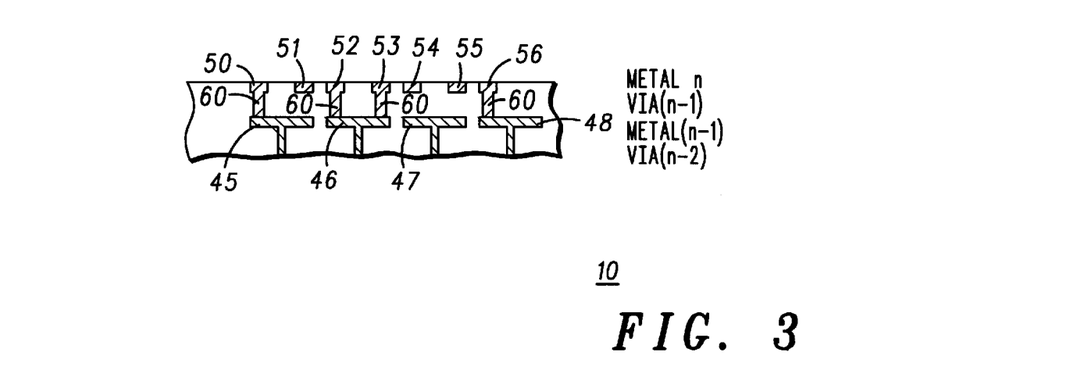
FIG. 3 is a sectional view, portions thereof broken away, as seen from section line 3—3 in FIG. 1.

Referring additionally to the sectional view along section line 3—3 of FIG. 3, it can be seen that a plurality of conductive pads 45, 46, 47, and 48, one for each of the shared source terminals 31, etc. of transistors 12, 70, 71, and 72 is formed in the final metal layer (metal layer n−1) of the plurality of metal layers. Conductive pads 45, 46, 47, and 48 are formed generally rectangularly shaped with the long axis in the plane of and across the paper in FIG. 3 to reduce chip area.

A plurality of read-out or evaluate lines or second signal lines 50, 51, 52, 53, 54, 55, and 56 are formed from metal layer n and connected to selected ones of conductive pads 45, 46, 47, and 48 by vias 60 that are selectively filled with an electrically conductive material; hence the vias that have been filled are referred to as filled vias. As can be seen best in FIG. 1, evaluate lines 50, 51, 52, 53, 54, 55, and 56 extend generally parallel to the rows of transistors with two evaluate lines being associated with each row of transistors in the array of transistors. For example, and referring specifically to FIGS. 1 and 3, it can be seen that evaluate lines 50 and 51 are associated with the row of transistors containing transistors 12, 13, 14, 15, etc., not shown in FIG. 1 or 3, evaluate lines 52 and 53 are associated with the next row of transistors, including transistor 70, evaluate lines 54 and 55 are associated with the next row of transistors including transistor 71, etc. Filled vias 60 couple selected ones of the conductive pads to selected ones of the plurality of evaluate lines to define first logic outputs of the row of memory cells. By observation of FIG. 1, in the first row of transistors filled vias 60 connect selected ones of conductive pads 45, etc. to selected ones of evaluate lines 50 and 51. For example, only evaluate line 50 is connected to conductive pad 45 and both evaluate lines 52 and 53 are connected to conductive pad 46. Also, evaluate lines 50 and 51 are both connected to the second conductive pad in the first row of transistors and only evaluate line 52 is connected to the second conductive pad in the second row of transistors.

Thus, to read-out the information stored in ROM 10 (and ignoring any addressing or other specific connections that may be included in the plurality of metal layers, 1 through n−1), individual memory cells in the array can be addressed by activating the transistor making up the cell. Taking transistor 12 as a specific example, the addressing is accomplished by connecting "pre-charge" line 36 to a common potential, such as ground, and providing an appropriate potential to gate 20. By applying an appropriate potential to evaluate line 50 and measuring the current flow the presence or absence of a filled via 60 between conductive pad 45 and evaluate line 50 can be determined. In the present example, current will flow because filled via 60 exists, i.e., the vias connecting evaluate line 50 to source 31 are filled with an electrically conductive material. Similarly transistor 70 may be addressed by properly biasing the first signal line or pre-charge line 36 and gate 20 and using the second signal lines or evaluate lines 52 and 53. In this instance current will flow for each evaluate line because a filled via 60 exists coupling the evaluate line to conductive pad 46.

Transistor 13 is addressed by connecting "pre-charge" line 37 to a common potential, such as ground, and providing an appropriate potential to gate 21. By applying an appropriate potential to evaluate line 51 and measuring the current flow the presence or absence of filled via 60 between conductive pad 45 and evaluate line 51 can be determined. In the present example, current will not flow because no filled via 60 exists (see FIGS. 1 and 3), i.e., the vias connecting evaluate line 51 to source 31 are not filled with an electrically conductive material.

Transistor 14 is addressed by connecting "pre-charge" line 37 to a common potential such as ground and providing an appropriate potential to gate 22 and is read by connecting evaluate line 50, 51 as described hereinbefore. Transistor 15 is addressed by connecting "pre-charge" line 38 and an appropriate potential as above to gate 23 and is read by connecting evaluate line 50, 51 as described hereinbefore. Both transistors 14 and 15 have a filled via 60 associated with them so that upon performing the read operation, current will flow for both evaluate lines. In a similar or analogous fashion, each cell in the array is read. In the present embodiment, current flow, or the presence of a filled via 60, is designated as a logic '1' while the absence of a filled via 60, or the lack of current flow, is designated as a logic '0'. As will be understood by those skilled in the art, the specific logic outputs can be reversed, depending upon the follow-on equipment.

Figure 4:
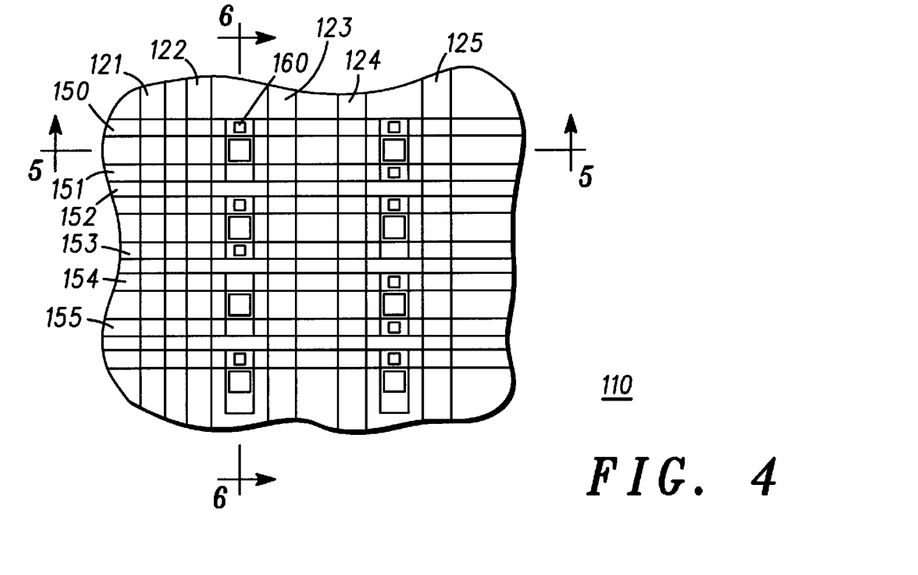
FIG. 4 is a plan view, portions thereof broken away, of a ROM array in accordance with another embodiment of the present invention.
Figure 5:
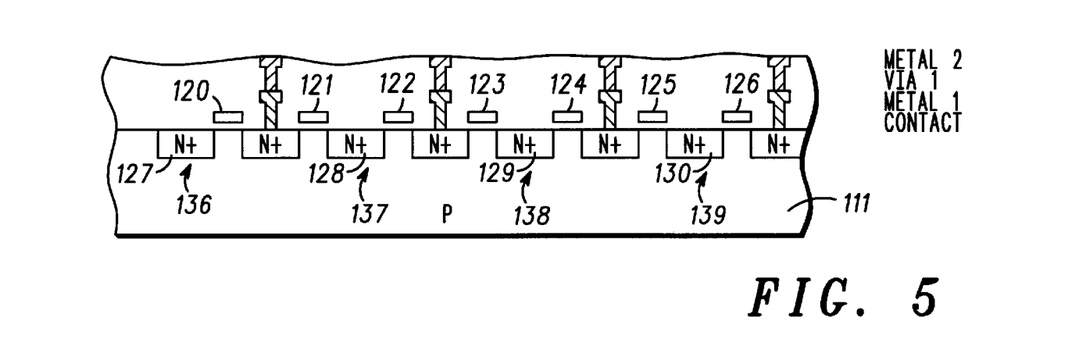
FIG. 5 is a sectional view, portions thereof broken away, as seen from section line 5—5 in FIG. 4.
Figure 6:
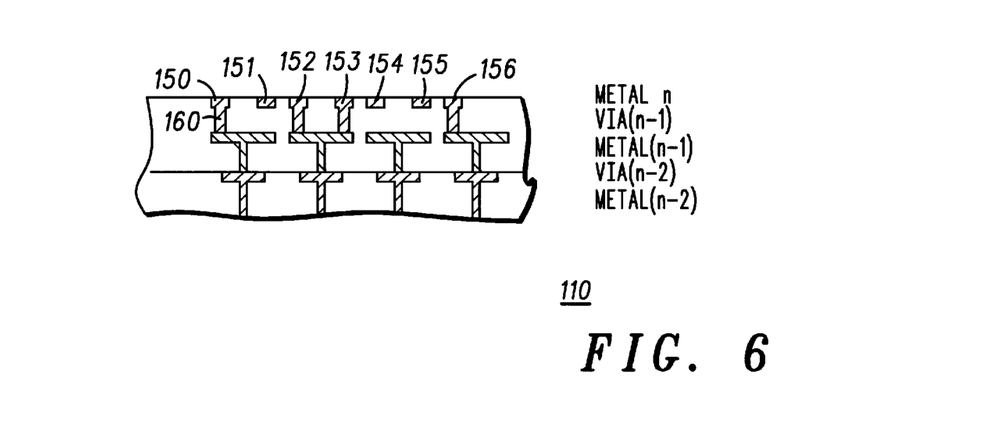
FIG. 6 is a sectional view, portions thereof broken away, as seen from section line 6—6 in FIG. 4.

FIG. 4 illustrates a Read-Only-Memory (ROM) 110 in accordance with another embodiment of the present invention. In this embodiment, components similar to those in FIGS. 1–3 are designated with a similar number and a 1 is added to the reference number to indicate the different embodiment. Generally, ROM 110 is similar to ROM 10, except that a plurality of pre-charge lines 136, 137, 138, and 139 are formed in substrate 111, for example as extensions of drain terminals 127, 128, 129, and 130 (e.g. doping an entire line instead of only individual drain terminals). (or by including polysilicon or other semiconductor material directly on the surface of substrate 111.) In any case, "pre-charge lines 136, 137, 138, and 139 extend perpendicular to the paper in the sectional view along section line 5—5 of FIG. 5. In this embodiment, the "pre-charge" lines may be contacted only at the edges of the array or blocks. As can be seen in FIG. 4, the gate lines and, hence, the transistors can be moved closer together which results in reducing the area of ROM 110. However, the performance of ROM 110 may be reduced relative to ROM 10, because of the higher resistance produced by the semiconductive "pre-charge" lines, but can be augmented by strapping or the like.

Thus, in either ROM 10 or ROM 110, all of the interconnect layers through metal layer n−1 can be completed prior to programming. At some convenient time after metal layer n−1 is completed, a layer of insulating material is deposited over metal layer n−1 and planarized. It should be noted that the planarization step is optional. A mask which includes the desired programming information (i.e., the presence or absence of each filled via 60 or 160) is used to form filled vias 60 or 160 in communication with the conductive pads. Here it will be understood that, depending upon the specific fabrication techniques used, filled vias 60 and 160 can be formed as a part of metal layer n−1, n or with another material (we call ?? plugs, see page 17) with very little change in the described procedure. After the formation of filled vias 60 or 160, final metal layer n is deposited and etched and a passivation layer is deposited and etched to complete the ROM.

As will be understood from the above description, either ROM 10 or ROM 110 is programmed with specific information after virtually the entire ROM has been fabricated. Therefore, future increasing numbers of interconnect layers will have little or no effect on the lateness of programming, since that step is performed after the interconnect layers are completed. Further, back-end cycle time for any specific code can be reduced substantially, since the ROMs are identical in all aspects until the programming steps. Also, bitcell size is kept small and even reduced in some applications. Thus, customer codes can be changed at virtually the last minute without substantially altering cycle time.

One method of reading either ROM 10 or ROM 110 is as follows:

A. Charge all "pre-charge" lines to $V_{D,Read}$;
B. Decode the address of the byte/block to be read;
C. Charge the selected gate electrode or electrodes to $V_{G,Read}$; and
D. Sense the appropriate evaluate line by whatever means decided upon.

In this method, the evaluate lines of cells with missing filled vias (60 or 160) will not be connected to their "pre-charge" lines and will not be brought to $V_{D,Read}$. These cells can be distinguished from the evaluate lines of cells with intact filled vias. Thus, the method allows the two bit-states to be distinguished.

An additional method of reading either ROM 10 or ROM 110 is as follows:

A. Charge the evaluate lines for the data to be read to $V_{D,Read}$;
B. Charge "precharge" lines to $V_{G,Read}$;
C. Decode the address of the data in that row;
D. Charge the selected gates to $V_{G,Read}$; and
E. Sense the appropriate evaluate line by whatever means decided upon.

With this sequence, the "pre-charge" lines of cells with missing filled vias will not be connected to their evaluate lines and as current will flow in corresponding evaluate lines.

Figure 7:
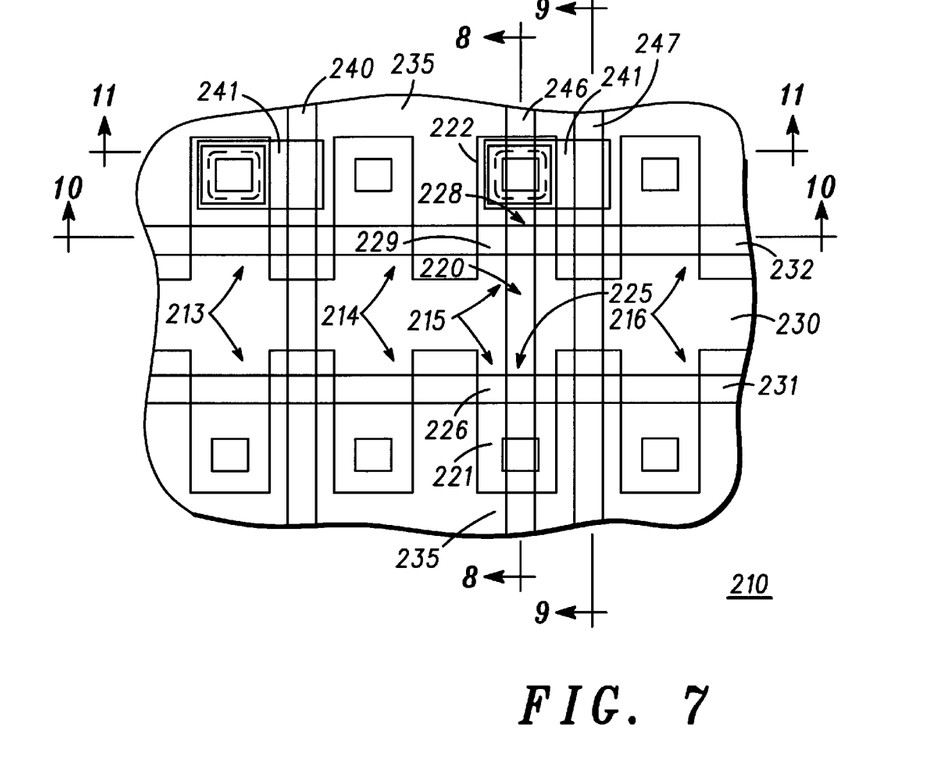
FIG. 7 is a plan view of a ROM array, portions thereof broken away, in accordance with yet another embodiment of the present invention.

Turning to FIG. 7, a plan view of another embodiment of a Read Only Memory (ROM) 210, in accordance with the present invention, is illustrated. In this embodiment, components similar to those in FIGS. 1–3 and FIGS. 4–6 are depicted and overall ROM 210 operates or may operate in an analogous fashion. Thus the discussions below will focus largely on distinctions and the minimum discussions required to explain FIGS. 7–12. Generally, ROM 210 is constructed similar to ROM 10, except that additional evaluate lines are included in metal layer n–2 (and/or other metal layers if desired see FIG. 12), as will be explained in more detail presently. The additional evaluate lines are then programmed by coupling, attaching, or connecting (or not) them by filled vias to conductive pads. As will be understood by those skilled in the art, the filled vias may be formed as separate plugs between the formation of metal layer n–2 and metal layer n–1 or during the formation of metal layer n–1, depending upon the specific process used.

In the embodiment illustrated in FIG. 7, only pairs 213, 214, 215, and 216 of transistors are illustrated for convenience and for clarity some layers have been omitted (for example, higher level metal layers are omitted on the left hand portion of FIG.7); however, as will be seen with reference to FIGS. 8–12, a complete array of transistors (in this embodiment NMOS transistors, although other conductivities or types of transistors could be used) is provided. Referring to pair 215 of transistors for example and referring additionally to the sectional view along section line 8—8 of FIG. 8, a semiconductor substrate 211 is provided, which in this embodiment is doped p-type. The plurality of pairs of switching transistors 213, 214, 215, and 216 are fabricated on the semiconductor substrate in rows and columns to form an array. FIG. 7 can be ??? to FIG. 1 if the reader considered the ?? take vertically and the columns to be horizontally oriented on the paper. Since each pair of switching transistors is substantially similar, only one pair 215 will be discussed in detail.

Figure 8:
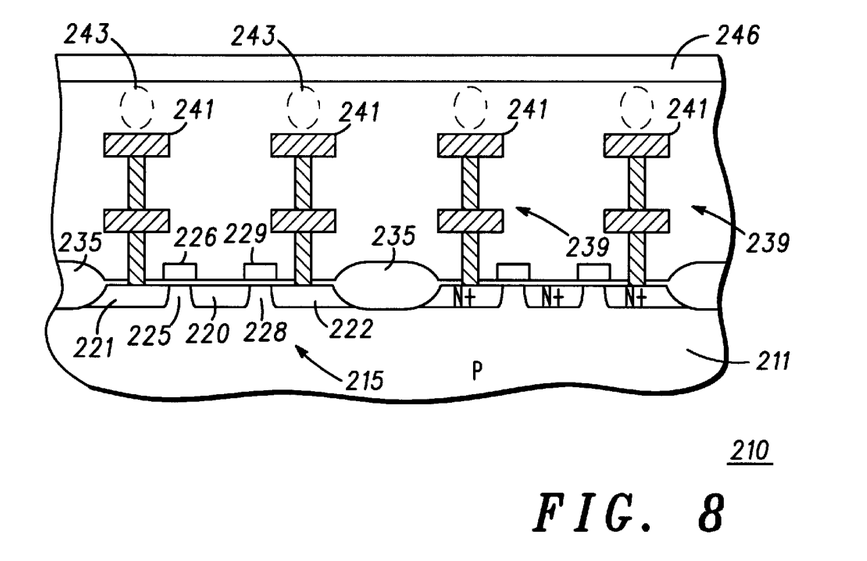
FIG. 8 is a sectional view, portions thereof broken away, as seen from section line 8—8 in FIG. 7.
Figure 9:
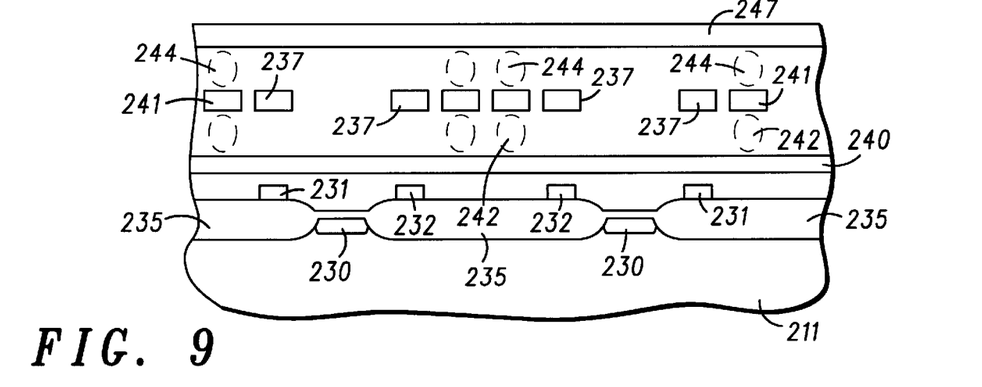
FIG. 9 is a sectional view, portions thereof broken away, as seen from section line 9—9 in FIG. 7.

Referring to FIGS. 7 and 8, it can be seen that pair of transistors 215 includes a common source terminal 220 with drain terminals 221 and 222 spaced from source terminal 220 on each side thereof. The spacings form a first channel area 225 with a gate terminal 226 in overlying position and a second channel area 228 with a gate terminal 229 in overlying position. As can be seen best in FIG. 7, common source terminal 220 and the other common source terminals in the adjacent pairs of switching transistors 213, 214, 215, and 216 are connected together by an address line 230 that is preferably an extension of the common source region 220. While a common source terminal is disclosed for each pair of switching transistors, it will be understood that the terminals could be connected so that the common terminal is a drain terminal, if desired. Also, each gate terminal for each transistor in a column of transistors is connected together by an address line, e.g., line 231 connecting gate terminal 226 and line 232 connecting gate terminal 229. These address lines 231 and 232 are preferably extensions perpendicular to the paper in FIG. 9 of the gate terminals 226 and 229. Lines 231 and 232 are formed of polysilicon in this embodiment but could be formed and/or connected in the first metal layer, if desired. Further, field oxide 235, or other means of insulation such as, for example, trench isolation, is positioned between and surrounding adjacent drain terminals to separate the pairs of transistors and prevent the formation of parallel and extraneous current paths. Here it should be noted that pairs of transistors sharing a common terminal are explained as a preferred embodiment, but each transistor could be fabricated separately without the shared terminal and/or without common address lines 231 and 232, if desired for some specific application.

Figure 10:
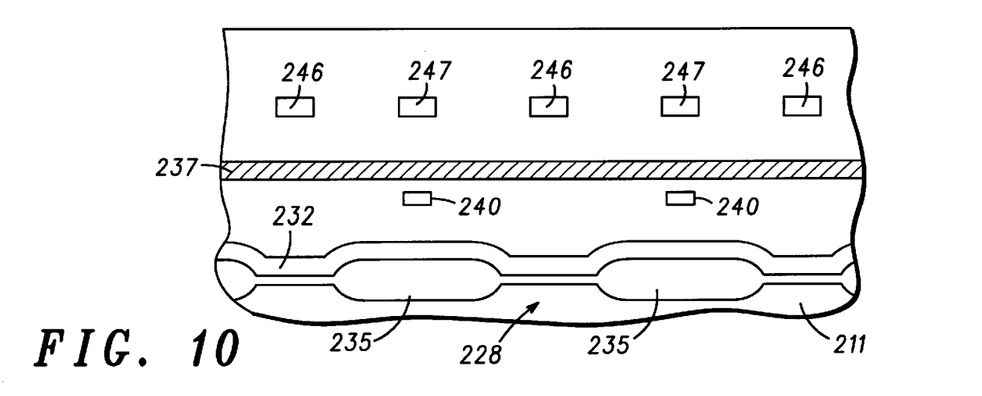
FIG. 10 is a sectional view, portions thereof broken away, as seen from section line 10—10 in FIG. 7.
Figure 11:
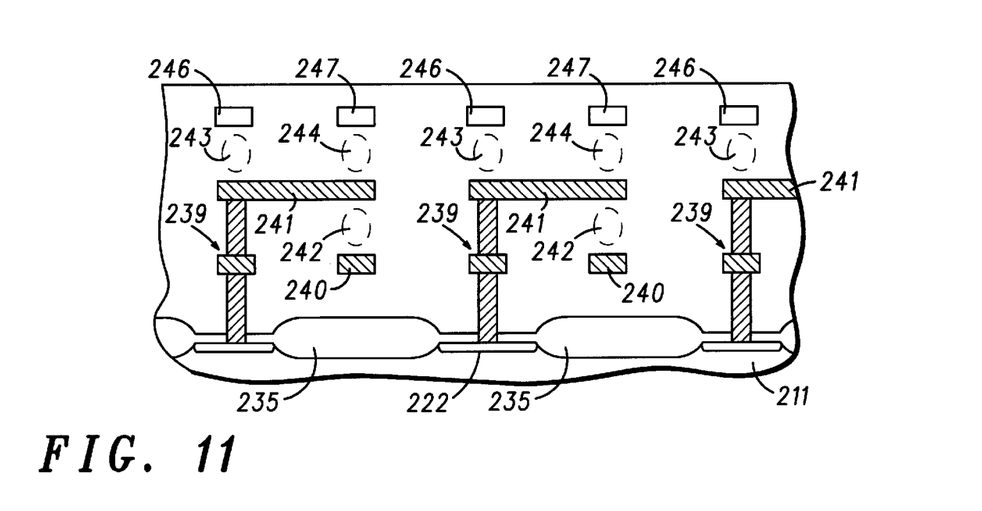
FIG. 11 is a sectional view, portions thereof broken away, as seen from section line 11—11 in FIG. 7.

A plurality of conductive layers (in this embodiment 1 through n–2) are sequentially formed and connected. Generally, these conductive layers coincide with the conductive layers normally formed during the fabrication of the associated integrated circuit and may include substantially any number desired or required by the associated integrated circuit. The plurality of conductive layers are connected to each drain (e.g. 221 and 222) of each pair of switching transistors 213, 214, 215, and 216 and to each other by vias filled with an electrically conductive material or the like. In FIGS. 8 and 11, this plurality of conductive layers is illustrated as a column 239 of metal positioned on and electrically connected to each drain terminal. Additionally, in this embodiment, a plurality of parallel bitlines 240 are formed in metal layer n–2 in spaced relationship from each other and from columns 239, as can be seen best in FIGS. 10 and 11. Optionally the gate strap 237 (not sown in FIG. 8) may be included and periodically connected to address lines 231, 232 thus gate terminals 229, 226.

A final conductive layer of the plurality of conductive layers (in this embodiment n–1) is deposited and formed to define a conductive pad 241 for each of the drain terminals and in contact with the associated drain terminal through the associated column 239. Conductive pads 241 have a slightly elongated configuration (see FIG. 7) so as to overlie the associated bitlines 240, as illustrated in FIG. 11. Filled vias 242, i.e., vias filled with an electrically conductive material are selectively formed between bitline 240 and selected conductive pads 241. As explained hereinbefore, filled vias 242 may be formed as separate plugs between the formation of metal layer n–2 and metal layer n–1 or during the formation of metal layer n–1, depending upon the specific process used. Generally, in this specific example, the inclusion of a filled via is indicated by a "0" and the omission of a filled via 242 is indicated by a "1".

In a similar fashion, a pair of filled vias 243 and 244, i.e., vias filled with an electrically conductive material are selectively formed or not formed between conductive pads 241 and a pair of bitlines 246 and 247. Bitlines 246 and 247 are formed in metal layer n and filled vias 243 and 244 can be formed as separate plugs between the formation of metal layers n and n–1 or as a portion of metal layer n or metal layer n–1, depending upon the process used. Again, in this specific embodiment the inclusion of a filled via 243 or 244 is indicated as a "0" output in conjunction with bitline 246 or 247, respectively, and the omission of a filled via 243 or 244 is indicated as a "1" output in conjunction with bitline 246 or 247, respectively. In this embodiment, a portion of the programming of ROM 210 is accomplished during the formation of the plurality of metal layers (i.e., the contact layer through metal layer n–1), that is the formation of filled vias 242. However, if only filled vias 243 and 244 are included, the programming all takes place after the formation of the plurality of metal layers. That is, all programming then occurs only with the formation of filled vias 243 and 244 and bitlines 246 and 247.

Generally, bitlines 240, 246, and 247, which may also be referred to as evaluate lines or signal lines, extend either to an edge of a block of ROM 210, to the edge of ROM 210, or the array of switching transistors where an external contact or terminal is provided. Thus, three evaluate lines, or signal lines or bitlines are positioned so that they can be selectively connected to each cell (switching transistor) in each row of cells in ROM 210 by filled vias 242, 243 or 244. Also, gates of transistor pairs 213, 214, 215 (specifically gates 228,229), and 216, etc. are connected in columns by word or address lines 231 and 232, which can be formed, for example, by polysilicon or the like. Each transistor in the array of transistors has three bitlines and three potentially filled vias associated with it thus providing two bits of data encoded by four distinct states. For convenience of the following explanation of operation, bitline 246 is designated BL0, bitline 247 is designated BL1, and bitline 240 is designated BL2.

In a preferred method of operation of ROM 210, the common source or signal line for each pair of transistors (e.g. source 220 for pair of transistors 215) is grounded by way of address line 230. Any individual transistor in the array of transistors can be addressed by supplying an activation potential to the address line 231 or 232 connected to the gate of the transistor to be addressed and supplying a "read" voltage sequentially to the bitlines BL0, BL1, and BL2 to be read. When bitline or signal line BL0 is activated or read, if filled via 243 is present, current will flow through the selected transistor, as indicated by a "0" in this example. If filled via 243 is not present, current will not flow through the selected transistor, as indicated by a "1" in this example. Similarly, as each bitline or signal line BL1 and BL2, is activated a "0" or a "1" will be read if filled vias 244 and 242 are present or absent, respectively.

In a preferred method of operation, voltage or current sensing is used to sense bitlines BL0, BL1, and BL2, simultaneously. In this encoding operation, four states are generated on the three evaluate or bitlines. Four states for this specific example are shown in TABLE 1 below.

TABLE 1

|          | BL0 | BL1 | BL2 |                   |
|----------|-----|-----|-----|-------------------|
| State 0: | 1   | 1   | 1   | No filled vias    |
| State 1: | 0   | 1   | 1   | filled via at 243 |
| State 2: | 1   | 0   | 1   | filled via at 244 |
| State 3: | 1   | 1   | 0   | filled via at 242 |

The above four states represent two bits of data. It is this encoding which allows the fabrication of a larger overall cell, but one that is smaller per bit due to the encoding. With more evaluate or bitlines more states can be encoded. The no programmed (no filled via) evaluate or bitline is one state and each filled via represents another state. As more layers of metal are used in the integrated circuit (or in the ROM), the same density is achieved but more bits are encoded. The additional bits, however, put the programming further ahead in the fabrication process.

It can be seen that the inclusion of the additional bitlines 240 and the optimally filled vias 242 provides an additional memory bit for each transistor in ROM 210 (i.e., over ROMs 10 or 110, illustrated in FIGS. 1 and 4, respectively). The embodiment of FIG. 7 (i.e., ROM 210) has the advantage of requiring approximately one half as much chip or IC area per bit as ROMs 10 or 110. The embodiment has the disadvantage of requiring two programming stages during fabrication. Also, the first programming stage is performed during the deposition of earlier metal layers, i.e., earlier in the fabrication process. However, in many applications the substantially reduced chip area per bit more than makes up for the earlier programming. In some specific applications, it may be convenient to include even more evaluate lines in earlier metal layers to further increase the number of memory bits that can be stored in each cell.

As will be understood from the various drawings and embodiments described, a major source of area savings in the new ROM is the availability of three or more metal layers in the multi-layered integrated circuit. In a traditional ROM, the goal is to produce a bit cell that is as small as possible, the size being controlled by the active area and the programming mechanism of the cell. Strapping and complex sense amplifiers follow to detect the current that the traditional cell can source or sink.

In the new ROM described herein, no special cell is produced because standard transistors can be used. Since each new cell can supply two bits of data, effectively twice the area is available for the device. That is, the area per bit has essentially been halved so that the area of each cell could be doubled and the module will still be the same size as prior art ROMs. Thus, in the new ROM there is a reduced burden to develop a smaller cell than presently disclosed or an innovative way of programming. Further, because of the novel new ROM cell structure, the cell size is metal limited and not dictated by the active area. Also, the size of the active area of the cells in the new ROM can be increased or decreased, increasing/decreasing the current sink/source and speed capabilities of the device without affecting array efficiency. This makes circuit design easier and less risky because a simpler sense mechanism can be produced to achieve either a very low power or very high speed ROM. Further, there is no process risk or additional process cost because the new ROM uses a native NMOS or PMOS low voltage device in the preferred embodiments or any native device in another process. In addition, the cells can easily be retargetted for different applications without changing the array efficiency because the active area can be sized independently.

Thus, several embodiments of read only memories embedded in multi-layered integrated circuits and methods of fabrication have been disclosed. In some of the embodiments the programming is performed with the deposition of a final metal layer and the ROM is then passivated. This provides a ROM which is standard until virtually the final processing step, so that last minute changes in codes will have very little effect on customer cycle time. In some embodiments, programming is performed with the deposition of two or more of the metal layers, optimally the last metal layers, and, while the fabrication is slightly more complicated, the chip area per bit is reduced substantially.

Figure 12:
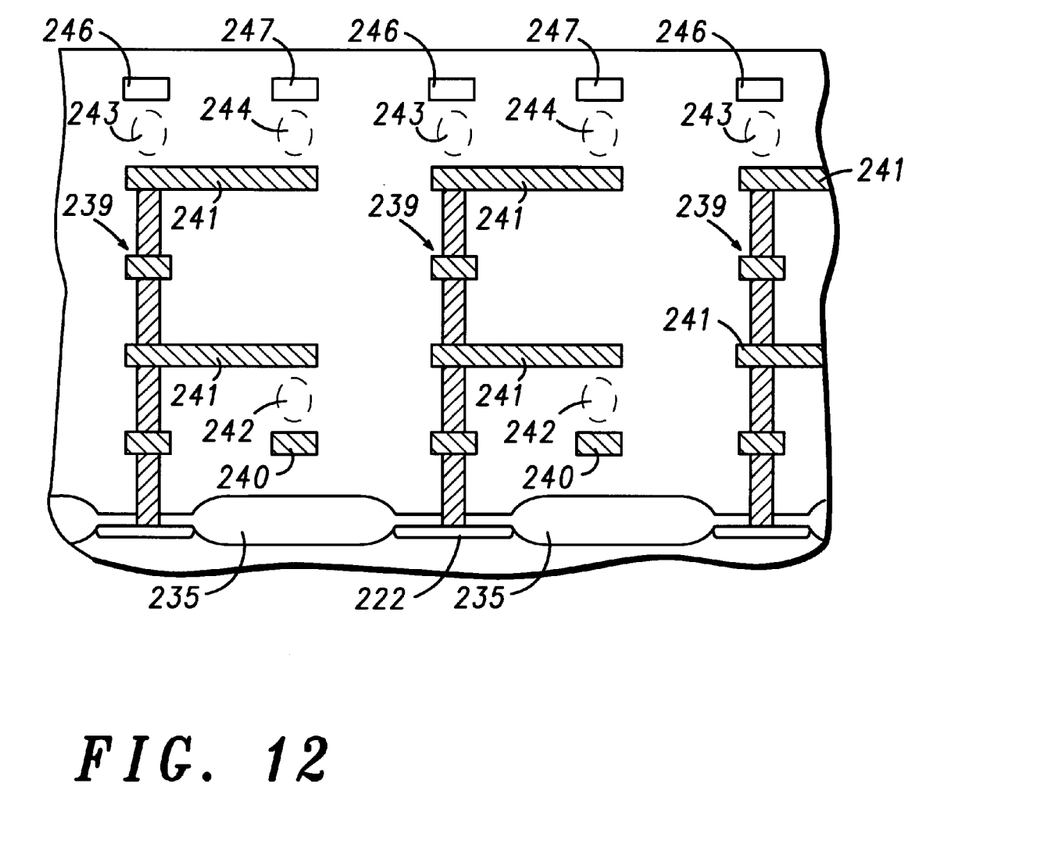
FIG. 12 is a sectional view of yet another embodiment of the present invention.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention. For example, ROM programming can be initiated at an earlier stage of the fabrication process than described in the embodiment shown in FIG. 11 by moving some of the programming vias to other layers such as shown in FIG. 12. Other examples include using more metal lines or layers or using more bitlines to encode more bits per transistor.

What is claimed is:

1. A method of manufacturing a Read Only Memory (ROM) embedded in a multi-layered integrated circuit, comprising:

provinding a semiconductor substrate;

fabricating a plurality of switching transistors on the semiconductor substrate in a row with each transistor of the plurality of transistors operating as a memory cell, and the memory cells arranged to form a row of memory cells;

forming a plurality of first signal lines and coupling one each first signal line to a first terminal of an associated switching transistor in the row of switching transistors, each first signal line of the plurality of first signal lines operating as one contact terminal for each memory cell in the row of memory cells;

forming a plurality of conductive layers and coupling the plurality of conductive layers to a second terminal of each switching transistor in the row of switching transistors and to each other by filled vias;

forming a plurality of conductive pads from one of the conductive layers, one each conductive pad connected to each of the second terminals;

forming second signal lines and coupling the second signal lines to selected ones of the conductive pads by filled vias, the second signal lines serving as output terminals of the row of memory cells;

forming a plurality of third signal lines and coupling selected third signal lines to selected conductive layers of the plurality of conductive layers by additional filled vias, the selected third signal lines serving as additional output terminals for the row of memory cells.

2. The method of claim 1, wherein fabricating the plurality of switching transistors on the semiconductor substrate includes positioning each transistor in the row so as to share a common terminal with an adjacent transistor in the row.

3. The method of claim 1, wherein the steps of forming the plurality of conductive layers and connecting the plurality of conductive layers to the second terminals and to each other by the filled vias further includes forming the plurality of third signal lines in a penultimate conductive layer and coupling selected ones of the plurality of third signal lines to selected ones of the conductive pads by more filled vias.

4. The method of claim 1, wherein fabricating the plurality of switching transistors includes fabricating a plurality of rows of switching transistors with each transistor of the plurality of switching transistors arranged on one of the rows of memory cells.

5. The method of claim 4, wherein fabricating the plurality of rows of switching transistors includes aligning the switching transistors such that the plurality of rows of switching transistors forms a matrix comprising the plurality of rows of switching transistors and a plurality of columns of switching transistors.

6. The method of claim 5, wherein the matrix is formed such that gate terminals of each switching transistor in a column are coupled to each other.

7. The method of claim 5, further comprising orienting each of the plurality of second signal lines generally parallel to the rows of switching transistors and providing each row of switching transistors with an associated pair of second signal lines.

8. The method of claim 1, further including forming the plurality of conductive layers and filled vias from metal.

9. A method of manufacturing a Read Only Memory (ROM), comprising:

providing a semiconductor substrate;

fabricating a plurality of switching transistors on the semiconductor substrate in a row with each transistor of the plurality of transistors operating as a memory cell and arranged to form a row of memory cells and positioning a first pair of transistors in the row so as to share a first common terminal, one transistor of said first pair forming, with an adjacent transistor in the row of memory cells, a second pair of transistors in the row so as to share a second common terminal;

forming a plurality of first signal lines and connecting a signal line of the plurality of first signal lines to the first common terminal and connecting another signal line of the plurality of first signal lines to the second common terminal;

sequentially forming a plurality of conductive layers on the semiconductor substrate, wherein portions of the conductive layers serve as conductive pads;

connecting selected conductive pads to one source/drain terminal of each switching transistor by filled vias;

forming a plurality of second signal lines, wherein a pair of the second signal lines of the plurality of signal lines is associated with each conductive pad in the plurality of conductive pads and selectively coupling the pair of second signal lines to the associated conductive pad, the plurality of second signal lines operating as additional output terminals for the row of memory cells.

10. A method of manufacturing a Read Only Memory, comprising:

providing a semiconductor substrate;

fabricating a plurality of switching transistors on the semiconductor substrate with each transistor of the plurality of transistors included in a row of memory cells;

forming a plurality of address lines and connecting one each to a first terminal of an associated switching transistor of the row of switching transistors, the address lines for selecting each memory cell to be read in the row of memory cells;

sequentially forming a plurality of conductive layers and connecting the plurality of conductive layers to a second terminal of each switching transistor in the plurality of switching transistors and to each other by filled vias;

forming a plurality of first bitlines from a conductive layer of the plurality of conductive layers;

forming a plurality of conductive pads from one of the plurality of conductive layers, one each conductive pad of the plurality of conductive pads connected to each of the second terminals of each switching transistor in the plurality of switching transistors;

coupling selected ones of the first bitlines and selected ones of the conductive pads with additional filled vias, the selected ones of the conductive pads serving as outputs of the row of memory cells;

forming a plurality of second bitlines from a further conductive layer;

coupling additional selected ones of the conductive pads to selected ones of the second bitlines by yet more filled vias, the additional selected ones of the conductive pads serving as further outputs of the row of memory cells.

11. The method of claim 10, wherein fabricating the plurality of switching transistors on the semiconductor substrate includes positioning each transistor in the row so as to share a common terminal with an adjacent transistor in the row.

12. The method of claim 10, wherein fabricating the plurality of switching transistors includes fabricating a plurality of rows of switching transistors with each transistor of the plurality of rows of transistors operating as a memory cell.

13. The method of claim 12, wherein fabricating the plurality of rows of switching transistors includes aligning the switching transistors such that the plurality of rows of switching transistors forms a matrix comprising the plurality of rows of switching transistors and a plurality of columns of switching transistors.

14. The method of claim 13, wherein the matrix is formed such that gate terminals of each switching transistor in a column are coupled to each other.

15. The method of claim 13, further including orienting each of the plurality of first bitlines generally parallel to the rows of switching transistors and providing each row of switching transistors with an associated pair of second bitlines.

16. The method of claim 10, further including fabricating the plurality of address lines with the common terminals and including a contact for each of the address lines adjacent an edge of the memory.

17. The method of claim 16, further including forming the plurality of address lines from a doped semiconductor material.

18. The method of claim 10, further including forming the plurality of conductive layers and the filled vias from metal.

* * * * *

UNITED STATES PATENT AND TRADEMARK OFFICE
CERTIFICATE OF CORRECTION

PATENT NO. : 6,355,550 B1
DATED : March 12, 2002
INVENTOR(S) : Patrice Parris et al.

It is certified that error appears in the above-identified patent and that said Letters Patent is hereby corrected as shown below:

<u>Title page,</u>
Item [75], Inventors, insert -- AZ (US) -- and change "AZ" to -- TX --

Signed and Sealed this

Fourth Day of February, 2003

JAMES E. ROGAN
*Director of the United States Patent and Trademark Office*